US010014289B2

(12) United States Patent
Besse et al.

(10) Patent No.: US 10,014,289 B2
(45) Date of Patent: Jul. 3, 2018

(54) ELECTROSTATIC DISCHARGE PROTECTION CIRCUITS AND STRUCTURES AND METHODS OF MANUFACTURE (71) Applicants: Patrice Besse, Tournfeuille (FR); Jean-Philippe Laine, saint lys (FR); Eric Pierre Rolland, Grepiac (FR)

(72) Inventors: Patrice Besse, Tournfeuille (FR); Jean-Philippe Laine, saint lys (FR); Eric Pierre Rolland, Grepiac (FR)

(73) Assignee: NXP USA, Inc., Austin, TX (US)

( * ) Notice: Subject to any disclaimer, the term of this patent is extended or adjusted under 35 U.S.C. 154(b) by 103 days.

(21) Appl. No.: 15/037,714

(22) PCT Filed: Nov. 22, 2013

(86) PCT No.: PCT/IB2013/002896
§ 371 (c)(1),
(2) Date: May 19, 2016

(87) PCT Pub. No.: WO2015/075495
PCT Pub. Date: May 28, 2015

(65) Prior Publication Data
US 2016/0300832 A1  Oct. 13, 2016

(51) Int. Cl.
H01L 27/02 (2006.01)
H01L 29/87 (2006.01)
(Continued)

(52) U.S. Cl.
CPC ........ H01L 27/0262 (2013.01); H01L 21/761 (2013.01); H01L 21/76264 (2013.01);
(Continued)

(58) Field of Classification Search
CPC ............ H01L 27/0259; H01L 27/0262; H01L 27/0292
See application file for complete search history.

(56) References Cited

U.S. PATENT DOCUMENTS 5,602,409 A    2/1997 Olney
6,717,219 B1   4/2004 Vashchenko et al.
(Continued)

FOREIGN PATENT DOCUMENTS

EP    2246885 A1    11/2010
JP    2010-182727 A  8/2010
WO    WO-02/075891 A1  9/2002

OTHER PUBLICATIONS

International Search Report for Application No. PCT/IB2013/002896 (dated Aug. 25, 2014).
Sarbishaei et al; "Adarlington-based SCR ESD protectiion device for high-speed applications"; IEEE Int'l Reliability Physicis Symposium 2008; IEEE Piscataway, NJ, US; pp. 63.

Primary Examiner — Raj R Gupta
(74) Attorney, Agent, or Firm — Charlene R. Jacobsen (57) ABSTRACT An ESD protection circuit and device structure comprises five transistors, two PNP and three NPN. The five transistors are coupled together so that a first NPN and PNP pair constitute a first silicon controlled rectifier, SCR. The NPN transistor 102 of the first SCR and a third transistor of NPN type are coupled so that they constitute a Darlington pair. A further NPN and PNP pair are coupled together to form a second SCR with the collector of the PNP transistor of the first SCR being coupled with the emitter of the PNP transistor of the second SCR. The circuit is particularly suitable for high voltage triggering applications and two or more devices may be cascaded in series in order to further increase the triggering voltage.

11 Claims, 5 Drawing Sheets (51) Int. Cl.
- *H01L 21/761* (2006.01)
- *H01L 21/762* (2006.01)
- *H01L 29/45* (2006.01)
- *H01L 29/06* (2006.01)

(52) U.S. Cl.
CPC ...... *H01L 27/0259* (2013.01); *H01L 27/0292* (2013.01); *H01L 29/87* (2013.01); *H01L 29/0649* (2013.01); *H01L 29/45* (2013.01)

(56) References Cited

U.S. PATENT DOCUMENTS

| | | |
|---|---|---|
| 8,212,320 B1 | 7/2012 | Vashchenko et al. |
| 8,390,092 B2 | 3/2013 | Gendron et al. |
| 2010/0193869 A1 | 8/2010 | Habasaki |
| 2010/0271741 A1* | 10/2010 | Galy .................. H01L 27/0262 361/56 |
| 2011/0176244 A1* | 7/2011 | Gendron ............ H01L 27/0259 361/56 |
| 2012/0080716 A1 | 4/2012 | Ker et al. |
| 2012/0241900 A1 | 9/2012 | Chen et al. |
| 2012/0250194 A1 | 10/2012 | Gallerano et al. |
| 2012/0295414 A1 | 11/2012 | Zhan et al. |
| 2013/0200493 A1 | 8/2013 | Sorgellos et al. |
| 2013/0279051 A1 | 10/2013 | Gill et al. |
| 2015/0221629 A1* | 8/2015 | Besse .................. H01L 29/7436 257/140 |

\* cited by examiner

ELECTROSTATIC DISCHARGE PROTECTION CIRCUITS AND STRUCTURES AND METHODS OF MANUFACTURE

FIELD OF THE INVENTION

This invention relates to electrostatic discharge protection circuits and structures and methods of manufacture, such devices being suitable for use for electrostatic discharge (ESD) protection in integrated and other circuits.

BACKGROUND OF THE INVENTION

Integrated circuits (ICs) and the devices therein are at risk of damage due to electrostatic discharge (ESD) events. Accordingly, it is commonplace to provide an ESD clamp (voltage limiting device) across the input and/or other terminals of such devices and IC's. U.S. 2012/0295414 describes a simple type of ESD clamp device comprising a bipolar transistor which may be connected across terminals of an IC. When the voltage across the terminals rises above the normal operating voltage and reaches a predetermined limit, the bipolar transistor turns on, thereby limiting the voltage across the terminals to a level below that capable of damaging the IC. Another known ESD protection device disclosed in US2012/0250194 comprises a silicon controlled rectifier (SCR) equivalent to a PNP transistor coupled with an NPN transistor whereby the base of the PNP transistor is connected to the collector of the NPN transistor and the base of the NPN transistor is connected to the collector of the PNP transistor. The voltage at which a transistor clamp device triggers can be dependent on the base-collector spacing dimensions of the transistor. US2012/0295414 also discloses a way of increasing the triggering voltage by forming two series-coupled transistors (constituting an SCR clamp) which have different base-collector spacings in a single integrated circuit package. Even higher triggering voltages can be achieved, as proposed in US2012/0295414, by serially cascading two or more of these clamp devices. This arrangement may be useful for high voltage (20 Volt, for example) applications. However, this may complicate the manufacturing process and can be uneconomical in terms of silicon area.

SUMMARY OF THE INVENTION

The present invention provides an electrostatic discharge protection circuit, structure and method of manufacture as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Figure 1:
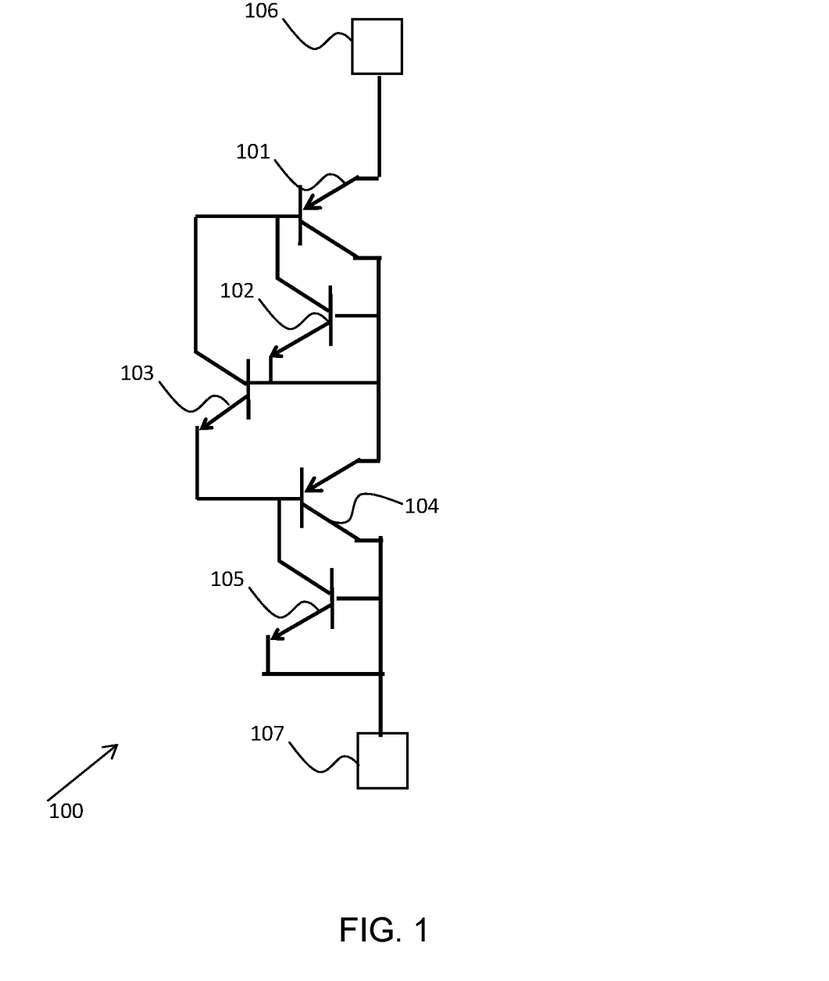
FIG. 1 is a simplified circuit diagram of a first example of an electrostatic discharge protection circuit.

FIG. 1 is a simplified circuit diagram of an example of an ESD protection circuit 100. The circuit 100 may comprise five transistors 101, 102, 103, 104 and 105. Two transistors 101, 104 may be of a first conductivity type. The remaining three transistors 102, 103 and 105 may be of a second conductivity type.

In the illustrated example embodiment of FIG. 1, the transistors 101,104 of a first conductivity type are PNP transistors and the transistors of the second conductivity type 102, 103 and 105 are NPN transistors. The five transistors may be operably coupled with one another.

A first transistor 101 of a first conductivity type and a second transistor 102 of a second conductivity type may be operably coupled so that they constitute a first silicon controlled rectifier, SCR, configuration.

The second transistor 102 of a second conductivity type and a third transistor 103 of a second conductivity type may be operably coupled so that they constitute a Darlington pair configuration.

The fourth transistor 104 of a first conductivity type and the fifth transistor 105 of a second conductivity type may be operably coupled to one another so that they constitute a second SCR configuration which may be operably coupled in series to the first SCR.

In one example embodiment, an emitter node of the first transistor 101 may serve as a first contact pad, or terminal 106 of the circuit 100. A base node of the first transistor 101 may be operably coupled to a collector node of the second transistor 102 and to the collector node of the third transistor 103. A collector node of the first transistor 101 may be operably coupled with a base node of the second transistor 102, a base node of the third transistor 103 and an emitter node of the fourth transistor 104.

An emitter node of the second transistor 102 may be operably coupled to the base node of the third transistor 103.

An emitter node of the third transistor 103 may be operably coupled to a base node of the fourth transistor 104 and to a collector node of the fifth transistor.

A collector node of the fourth transistor 104 may be operably coupled with a base node of the fifth transistor 105 and may also be operably coupled with a second contact pad 107 which may form a second terminal of the circuit and which may be grounded.

An emitter node of the fifth transistor 105 may be operably coupled to the second contact pad of 107 the circuit.

A stack of two SCR clamps ensures good transient response.

The advantage of including the Darlington pair arrangement 102, 103 with the double SCR clamp arrangement 101, 102 and 104, 105 is that it allows more current to be diverted away from the device which the ESD circuit is protecting because of the current amplification provided by the Darlington pair. That is to say that the series "on" resistance is much reduced compared with a conventional SCR clamp arrangement.

An example of an ESD protection device structure will now be described with reference to FIG. 2. The structure described below with reference to FIG. 2 may be considered to be an implementation of the simplified circuit diagram of FIG. 1.

An ESD protection device 200 may comprise a semiconductor region 201 of a first type. The semiconductor region 201 may be an epitaxial region and in one example embodiment, may be a P type epitaxial region.

A first, first type well 202 may be formed within the semiconductor region 201 and within this first, first type well, a first, first type doped region 203 may be formed. The first, first type doped region 203 may serve as a first contact pad (106) of the device 200. In one example embodiment, the first, first type well 202 may be a P type well and the first, first type doped region may be a P type doped region.

A first, second type well 204 may be formed within the semiconductor region 201. The first, first type well 202, the first, second type well 204 and the semiconductor region 201 may constitute a first transistor 101 of a first conductivity type. In one embodiment, this transistor 101 may be a PNP transistor.

A second, first type well 205, which in one example may be a P well, may be formed within the semiconductor region 201 and within this second, first type well 205 a first, second type doped region 206 and a second, first type doped region 207 may be formed. These two doped regions 206, 207 may be joined together by a first conducting link 208 external to the semiconductor region 201. In one example embodiment, the first, second type doped region 206 may be an N type doped region and the second, first type doped region 207 may be a P type doped region.

The first, second type well 204, the semiconductor region 201 and the first, second type doped region 206 may constitute a second transistor 102 of a second conductivity type. In one embodiment, this transistor 102 may be an NPN transistor.

A second, second type well 209 may be formed within the semiconductor region 201. In one embodiment, this second, second type well 209 may be an N well. The first, second type well 204, the semiconductor region 201 and the second, second type well 209 may constitute a third transistor 103 of a second conductivity type. In one embodiment, this third transistor 100 may be an NPN transistor.

A third, first type well 210 may be formed within the semiconductor region 201. In one embodiment, the third, first type well 210 may be a P well. A second, second type doped region 211 and a third, first type doped region 212 may be formed within the third, first type doped region 210. In one embodiment, the second, second type doped region 211 may be an N type doped region and the third, first type doped region may be a P type doped region. These two doped regions 211, 212 may be joined together by a second conducting link 213 external to the semiconductor region 201 to provide a second contact pad 107 of the device 200.

The semiconductor region 201, the second, second type well 209 and the semiconductor region 201 may constitute a fourth transistor 104 of a first conductivity type. In one embodiment, his transistor 104 may comprise a PNP transistor. The second, second type well 209, the semiconductor region 201 and the second, second type doped region 211 may constitute a fifth transistor 105 of a second conductivity type. In one embodiment, this fifth transistor may comprise an NPN transistor.

In one example embodiment, the semiconductor region 201 may be provided with an insulating base 214 and sidewalls 215, 216 which may comprise deep trench isolation layers.

In one example embodiment, a first, second type buried oxide layer 217 may be formed in a lower portion of the semiconductor region 201 and may overlap a lower portion of the first second type well 204. A second, second type buried oxide layer 218 may be formed in a lower portion of the semiconductor region 201 and may overlap a lower portion of the second, second type well 209. These two buried oxide layers 217, 218 may be provided in order to ensure that those parts of the semiconductor region 201 which lie under the first, second and third first type wells 202, 205, 210 are isolated from one another. Relying solely on the second type wells 204, 209 may be insufficient if these second type wells do not contact the insulating layer 214 below.

The ESD protection device 200 may be mounted on a semiconductor substrate 221.

In one embodiment, upper surfaces of the first, first type well 202, the first, second type well 204, the second, first type well 205, the second, second type well 209 and the third, first type well 210 may be separated from one another by shallow trench isolation layers 222.

In one example, the first, first type well 202 may also include a third, second type doped region 219 which may be linked externally to the first, first type doped region 203 by an external conducting link 220. In this manner, a bi-directional device may be provided which may function for a positive and a negative stress.

Figure 2:
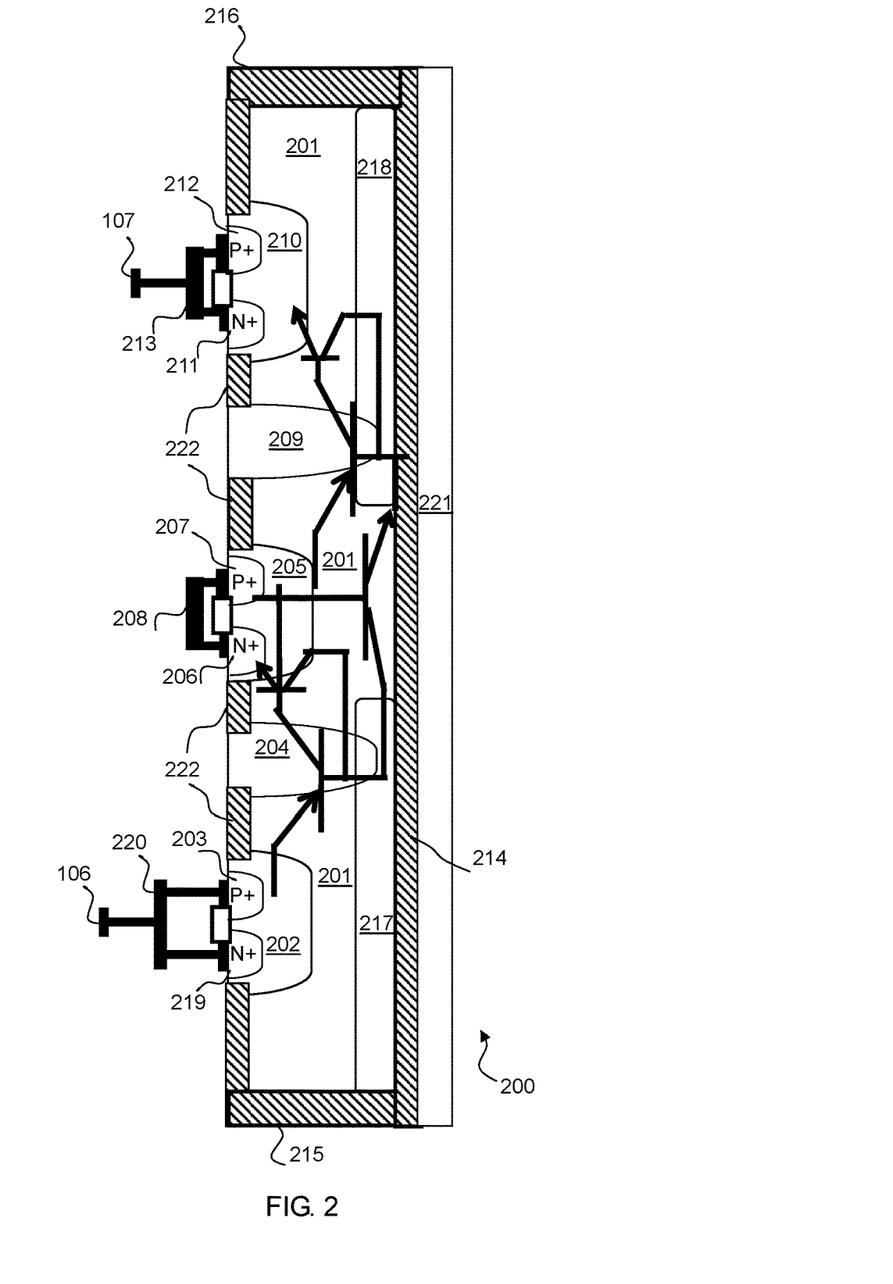
FIG. 2 is a simplified diagram of a cross-section through a first example of an electrostatic discharge protection device structure.

The example embodiment of FIG. 2 is, effectively, a merging of two, cascaded SCR stacks where in one embodiment, the second (central) first type well 205 may serve as the "P" part of an NPN bipolar transistor comprising part of a first SCR and may also serve as the "P" part of a PNP transistor comprising a part of a second SCR. Thus a more compact device may be realised.

Figure 3:
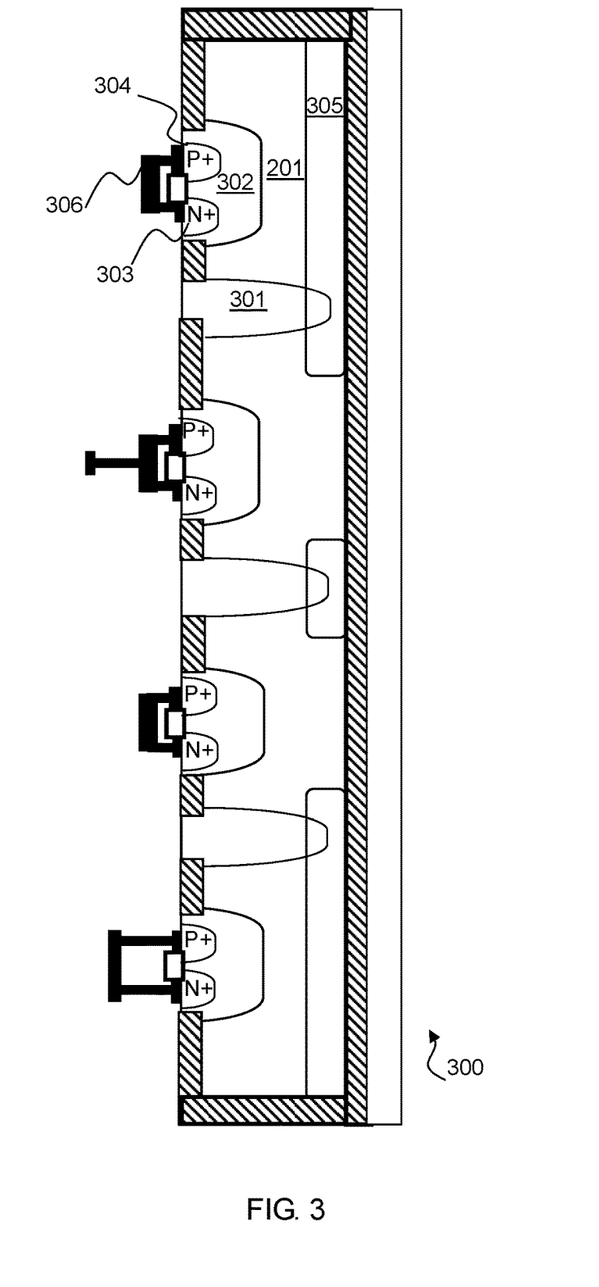
FIG. 3 is a simplified diagram of a cross-section through a second example of an electrostatic discharge protection device structure.

Example embodiments of an ESD protection device suitable for high voltage (typically 40 Volts) applications may be fabricated having a reduced silicon area compared with known devices In order to provide an ESD protection device for even higher voltage applications, the ESD protection device structure 200 of FIG. 2 may be cascaded with a second identical ESD protection device structure 200 by operably coupling the second contact pad 107 of a first structure with the first contact pad 106 of the second structure. Alternatively, one or more additional SCR/Darlington stages may be formed in the semiconductor region 201 by replicating doped regions and wells. For example, the ESD protection structure of FIG. 2 may be modified by forming additional stages, each additional stage comprising a second type well and a first type well which has formed therein a doped region of a first type and a doped region of a second type. FIG. 3 schematically shows a cross sectional view of an ESD protection device structure in accordance with such an embodiment and FIG. 4 is a circuit diagram of this alternative embodiment.

With reference to FIG. 3, a second example of an ESD protection device structure 300 has certain features in common with the example of FIG. 2, the common features having the same reference numerals as those shown in FIG. 2 and being formed in the same fashion. The ESD protection device structure 300 may comprise a third, second type well 301 formed within the semiconductor region 201. The second, second type well 209, the semiconductor region 201 and the third, second type well 301 may then comprise a sixth transistor 401 (see FIG. 4) of a second conductivity type. Further, the semiconductor region 201, the third, second type well 301 and the semiconductor region 201 may comprise a seventh transistor 402 (see FIG. 4) of a first conductivity type. A fourth, first type well 302 may be formed within the semiconductor region 201 and may include a fourth, second type doped region 303 and a fourth, first type doped region 304. The third, second type well 301, the semiconductor region 201 and the fourth, second type doped region 303 may comprise an eighth transistor 403 of a second conductivity type. In one embodiment, a third, second type buried oxide layer 305 may be formed in a lower portion of the semiconductor region 201 and overlapping a lower portion of the third, first type well 301. An external conducting link 306 may be provided for linking the fourth doped regions 303, 304 of second and first types and may serve as a contact pad of the device structure 300 which may be grounded. In this way, an ESD protection circuit comprising two Darlington pairs and three series-connected silicon controlled rectifiers may be realised.

Figure 4:
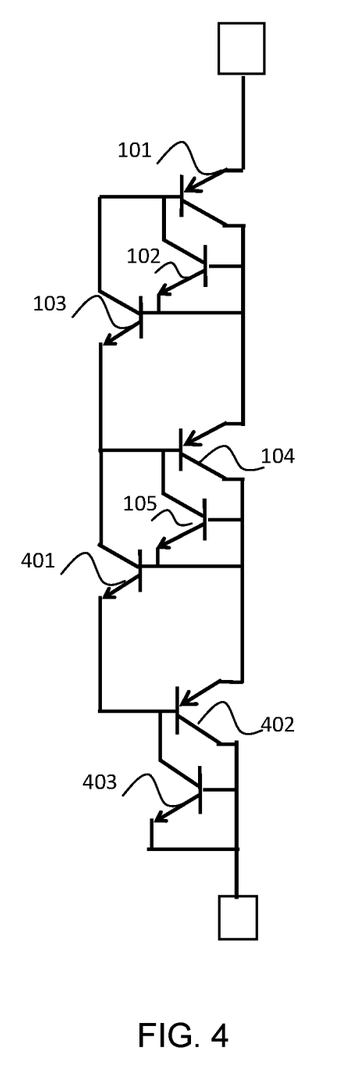
FIG. 4 is a simplified circuit diagram of a second example of an electric discharge protection circuit.

FIG. 4 illustrates the circuit equivalent to the structure of FIG. 3. The circuit of FIG. 4 comprises the five transistors 101, 102, 103, 104, 105 of FIG. 1 and an additional three transistors 401, 402, 403 mentioned above with reference to FIG. 3. The additional transistors 401 and 403 may be of a second conductivity type and the additional transistor 402 may be of a first conductivity type. The first type transistor may be PNP transistors and the second type transistors may be NPN transistors.

As in FIG. 1, the first transistor 101 of a first conductivity type and the second transistor 102 of a second conductivity type may be operably coupled so that they constitute a first silicon controlled rectifier, SCR, configuration.

The second transistor 102 of a second conductivity type and a third transistor 103 of a second conductivity type may be operably coupled so that they constitute a Darlington pair configuration.

The fourth transistor 104 of a first conductivity type and the fifth transistor 105 of a second conductivity type may be operably coupled so that they constitute a second SCR configuration.

The fifth transistor 105 of a second conductivity type and the sixth transistor 401 of a second conductivity type may be operably coupled so that they form another Darlington configuration.

The seventh transistor 402 of a first conductivity type and the eighth transistor 403 of a second conductivity type may be operably coupled to form a further SCR configuration. Thus the circuit 300 of FIG. 3 may comprise three series-coupled SCRs.

In one example embodiment, an emitter node of the first transistor 101 may serve as a first contact pad, or terminal 106 of the circuit 100. A base node of the first transistor 101 may be operably coupled to a collector node of the second transistor 102 and to the collector node of the third transistor 103. A collector node of the first transistor 101 may be operably coupled with a base node of the second transistor 102, a base node of the third transistor 103 and an emitter node of the fourth transistor 104.

An emitter node of the second transistor 102 may be operably coupled to the base node of the third transistor 103.

An emitter node of the third transistor 103 may be operably coupled to a base node of the fourth transistor 104 and to a collector node of the fifth transistor and to a collector node of the sixth transistor 302.

A collector node of the fourth transistor 104 may be operably coupled with a base node of the fifth transistor 105 and may also be operably coupled with a base node of the sixth transistor 401 and an emitter node of the seventh transistor 402.

An emitter node of the sixth transistor 401 may be operably coupled with a base node of the seventh transistor 402 and a collector node of the eighth transistor 403.

A collector node of the seventh transistor 402 may be operably coupled with a base node of the eighth transistor 403 and to a contact pad 107 of the circuit 400 which may be grounded.

An emitter node of the eighth transistor 403 may also be operably coupled with the (grounded) contact pad 107.

Figure 5:
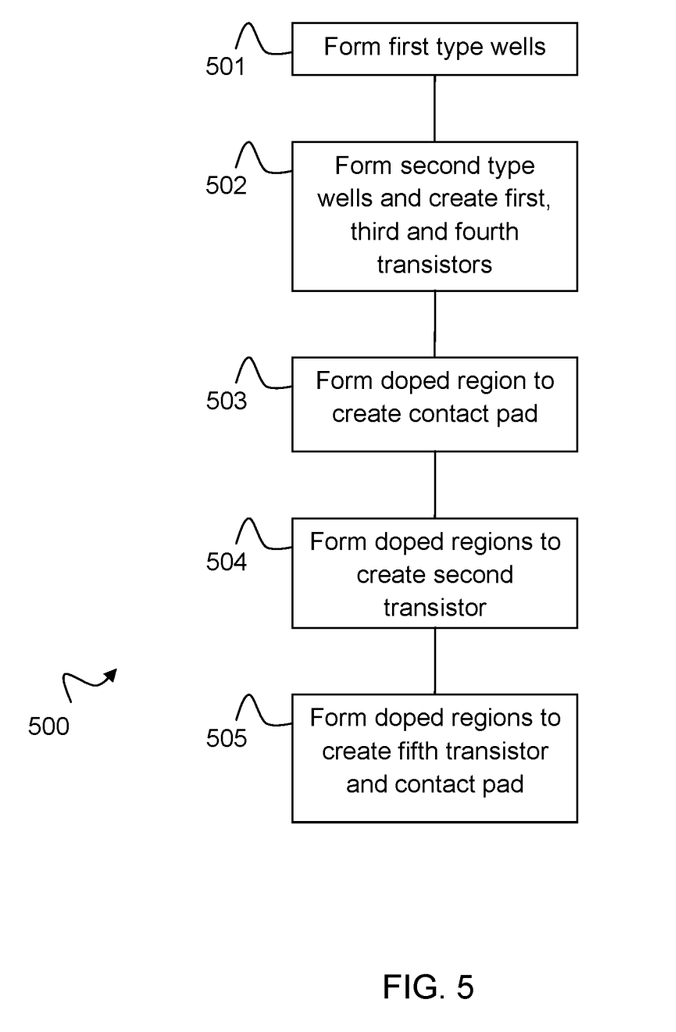
FIG. 5 is a simplified flowchart of an example of a method of manufacturing an electrostatic discharge protection device structure.

FIG. 5 is a simplified flowchart of an example of a method 500 for manufacturing an ESD protection device structure. The method may include providing an insulating layer below a semiconductor region of a first type and insulating side walls at the sides of the semiconductor region. The side walls may comprise deep trench isolation regions. In one example, the semiconductor region may be an epitaxial region. In one embodiment, the semiconductor region may be P type.

With reference to FIG. 5 and to FIG. 2, at 501, first, second and third first type wells 202,205 and 210 respectively may be formed in the semiconductor region 201. These three wells may be spaced apart from each other and may all extend the same depth into the semiconductor region. In one example embodiment, these first type wells may be P-type wells.

At 502 first and second, second type wells 204, 209 respectively may be formed in the semiconductor region 201 and in the intervening spaces between the first type wells. The wells may be separated from each other by shallow trench isolation regions. In one example embodiment, the second type wells may be N-type wells. The first, first type well, the first second type well and the semiconductor region may constitute a transistor of a first type. This transistor may comprise the first transistor 101 of FIG. 1. The first, second type well, the semiconductor region and the second, second type well may constitute a transistor of a second type. This transistor may comprise the third transistor 103 of FIG. 1. The semiconductor region, second, second type well and the semiconductor region may constitute a further transistor of a first type. This transistor may comprise the fourth transistor 104 of FIG. 1.

At 503, a first, first type doped region 203 may be formed in the first, first type well. This first, first type doped region may serve as a contact pad (or terminal) of the device 200. In one example embodiment, the first, first type doped region may be a P-type doped region.

At 504, a first, second type doped region 206 and a second, first type doped region 207 may be formed in the second, first type well. In one example embodiment, the first, second type doped region may be an N-type doped region and the second, first type region may be a P-type doped region. The first, second type well, the semiconductor region and the first, second type doped region may constitute a second transistor of a second type. This transistor may comprise the transistor 102 of FIG. 1. In one embodiment, the first, second type doped region 206 and the second, first type doped region 207 may be operably coupled via an external conducting link 208.

At 505, a second, second type doped region 211 and a third, first type doped region 212 may be formed in the third, first type well. In one example embodiment, the second, second type doped region may be an N-type doped region and the third, first type region may be a P-type doped region. The second, second type well, the semiconductor region and the second, second type doped region may constitute a fifth transistor of a second type. This transistor may comprise the transistor 105 of FIG. 1. In one embodiment, the second, second type doped region and the third, first type doped region may form a contact pad (or terminal) of the device and may be operably coupled together externally.

In the foregoing specification, the invention has been described with reference to specific examples of embodiments of the invention. It will, however, be evident that various modifications and changes may be made therein without departing from the broader spirit and scope of the invention as set forth in the appended claims. For example, the semiconductor regions described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" "above" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples of an ESD protection device structure may be implemented as circuitry implemented in a single integrated circuit or within a device which the circuit is protecting against ESD events. That is to say that an ESD protection device structure may be may be implemented in an integrated circuit. Such an integrated circuit may be a package containing one or more dies. For example, an integrated circuit device may comprise one or more dies in a single package with electronic components provided on the dies that form the modules and which are connectable to other components outside the package through suitable connections such as pins of the package and bondwires between the pins and the dies.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. An electrostatic discharge protection device structure comprising a semiconductor region of a first type, a first, first type well formed within the semiconductor region and including a first, first type doped region for providing a first contact pad of the device, a first, second type well formed within the semiconductor region, the first, first type well, the first, second type well and the semiconductor region constituting a first transistor of a first conductivity type, a second, first type well formed within the semiconductor region and including a first second type doped region and a second, first type doped region, the first, second type well, the semiconductor region and the first, second type doped region constituting a second transistor of a second conductivity type, a second, second type well formed within the semiconductor region, the first, second type well, the semiconductor region and the second, second type well constituting a third transistor of a second conductivity type, a third, first type well formed within the semiconductor region and including a second, second type doped region and a third, first type doped region, the semiconductor region, the second, second type well and the semiconductor region constituting a fourth transistor of a first conductivity type, and the second, second type well, the semiconductor region and the second, second type doped region constituting a fifth transistor of a second conductivity type.

2. The ESD protection structure of claim 1 comprising at least one additional stage for providing additional series-connected transistors wherein an additional stage comprises a second type well formed within the semiconductor region and a first type well formed within the semiconductor region and having a first type doped region and a second type doped region formed therein.

3. The ESD protection structure of claim 2 comprising a third, second type well formed within the semiconductor region, the second, second type well, the semiconductor region and the third, second type well comprising a sixth transistor of a second conductivity type, the semiconductor region, the third, second type well and the semiconductor region comprising a seventh transistor of a first conductivity type, a fourth, first type well formed within the semiconductor region and including a fourth, second type doped region and a fourth, first type doped region, the third, second type well, the semiconductor region and the fourth, second type doped region comprising an eighth transistor of a second conductivity type.

4. The ESD protection device structure of claim 1 and including a first, second type buried oxide layer formed in a lower portion of the semiconductor region and overlapping a lower portion of the first second type well, and a second, second type buried oxide layer formed in a lower portion of the semiconductor region and overlapping a lower portion of the second, second type well.

5. The ESD protection device structure of claim 1 comprising an insulating base and sidewalls, said sidewalls comprising deep trench isolation regions.

6. The ESD protection device structure of claim 1 and comprising shallow trench isolation regions arranged to separate the first type wells from the second type wells.

7. The ESD protection device structure of claim 1 wherein a first type is a P-type and a second type is an N type and transistors of a first conductivity type are PNP transistors and transistors of a second conductivity type are NPN transistors.

8. The ESD protection device structure of claim 1 wherein the semiconductor region is an epitaxial region.

9. The ESD protection device structure of claim 1 comprising a first conducting link operably coupled between the first, second type doped region and the second, first type doped region.

10. The ESD protection device structure of claim 1 comprising a second conducting link operably coupled between the second, second type doped region and the third, first type doped region.

11. The ESD protection device structure of claim 1 wherein the ESD protection device structure is implemented in an integrated circuit device.

* * * * *